(12) United States Patent
Zhang et al.

(10) Patent No.: US 9,804,918 B1
(45) Date of Patent: Oct. 31, 2017

(54) METHOD AND APPARATUS FOR GENERATING A PHY DATA UNIT

(71) Applicant: Marvell International Ltd., Hamilton (BM)

(72) Inventors: Hongyuan Zhang, Fremont, CA (US); Mingguang Xu, San Jose, CA (US); Yakun Sun, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 72 days.

(21) Appl. No.: 14/882,123

(22) Filed: Oct. 13, 2015

Related U.S. Application Data (60) Provisional application No. 62/062,301, filed on Oct. 10, 2014.

(51) Int. Cl.
| | |
|---|---|
| *G06F 11/00* | (2006.01) |
| *G06F 11/10* | (2006.01) |
| *H04L 1/00* | (2006.01) |
| *H03M 13/00* | (2006.01) |

(52) U.S. Cl.
CPC ............ *G06F 11/10* (2013.01); *H03M 13/00* (2013.01); *H04L 1/0041* (2013.01)

(58) Field of Classification Search
CPC ...... G06F 11/10; H04L 1/0041; H04L 1/0091; H04L 5/001; H04L 5/0094
See application file for complete search history.

(56) References Cited

U.S. PATENT DOCUMENTS

| | | | |
|---|---|---|---|
| 7,530,001 B2 * | 5/2009 | Naoi ................. | H04L 1/188 714/707 |
| 7,599,332 B2 | 10/2009 | Zelst et al. | |
| 7,742,390 B2 | 6/2010 | Mujtaba | |
| 7,822,152 B2 * | 10/2010 | Inagawa ............. | H04B 1/7183 375/343 |
| 8,155,138 B2 | 4/2012 | van Nee | |
| 8,289,869 B2 | 10/2012 | Sawai | |

(Continued)

OTHER PUBLICATIONS

IEEE Std 802.11ac/D2.0 "Draft Standard for Information Technology—Telecommunications and information exchange between systems—Local and metropolitan area networks—Specific requirements, Part 11: Wireless LAN Medium Access Control (MAC) and Physical Layer (PHY) specifications: Amendment 4: Enhancements for Very High Throughput for Operation in Bands below 6 GHz," *The Institute of Electrical and Electronics Engineers, Inc.*, pp. 1-359 (Jan. 2012).

(Continued)

*Primary Examiner* — Esaw Abraham (57) ABSTRACT

A physical layer (PHY) preamble is generated, the PHY preamble defined by a first wireless communication protocol and including a first portion that corresponds to a legacy PHY preamble defined by a second, legacy wireless communication protocol. The PHY preamble also includes a second portion that is defined by the first wireless communication protocol. Error detection information is generated using a first field in the first portion of the PHY preamble. The second portion of the PHY preamble is generated to include the error detection information in a second field. The PHY data unit is generated so that the PHY data unit includes the PHY preamble.

22 Claims, 8 Drawing Sheets

(56) References Cited

U.S. PATENT DOCUMENTS

| | | | | |
|---|---|---|---|---|
| 8,307,270 | B2* | 11/2012 | Kim | G06F 11/1028 365/120 |
| 8,359,530 | B2* | 1/2013 | Sawai | H04L 27/2655 714/776 |
| 8,526,351 | B2 | 9/2013 | Fischer et al. | |
| 8,619,907 | B2 | 12/2013 | Mujtaba et al. | |
| 8,867,563 | B1* | 10/2014 | Cho | H04W 28/06 370/335 |
| 9,300,511 | B2* | 3/2016 | Abraham | H04L 27/2607 |
| 2009/0196163 | A1 | 8/2009 | Du | |
| 2011/0002219 | A1 | 1/2011 | Kim et al. | |

OTHER PUBLICATIONS

IEEE Std 802.11ac/D2.1 "Draft Standard for Information Technology—Telecommunications and information exchange between systems—Local and metropolitan area networks—Specific requirements, Part 11: Wireless LAN Medium Access Control (MAC) and Physical Layer (PHY) specifications: Amendment 4: Enhancements for Very High Throughput for Operation in Bands below 6 GHz," *The Institute of Electrical and Electronics Engineers, Inc.*, pp. 1-363 (Mar. 2012).

IEEE Std 802.11ac/D3.0 "Draft Standard for Information Technology—Telecommunications and information exchange between systems—Local and metropolitan area networks—Specific requirements, Part 11: Wireless Lan Medium Access Control (MAC) and Physical Layer (PHY) specifications: Amendment 4: Enhancements for Very High Throughput for Operation in Bands below 6 GHz," *The Institute of Electrical and Electronics Engineers, Inc.*, pp. 1-385 (Jun. 2012).

IEEE Std 802.11ac/D4.0 "Draft Standard for Information Technology—Telecommunications and information exchange between systems—Local and metropolitan area networks—Specific requirements, Part 11: Wireless LAN Medium Access Control (MAC) and Physical Layer (PHY) specifications: Amendment 4: Enhancements for Very High Throughput for Operation in Bands below 6 GHz," *The Institute of Electrical and Electronics Engineers, Inc.*, pp. 1-408 (Oct. 2012).

IEEE Std 802.11ac/D5.0 "Draft Standard for Information Technology—Telecommunications and information exchange between systems—Local and metropolitan area networks—Specific requirements, Part 11: Wireless LAN Medium Access Control (MAC) and Physical Layer (PHY) specifications: Amendment 4: Enhancements for Very High Throughput for Operation in Bands below 6 GHz," *The Institute of Electrical and Electronics Engineers, Inc.*, pp. 1-440 (Jan. 2013).

IEEE Std 802.11ac/D6.0 "Draft Standard for Information Technology—Telecommunications and information exchange between systems—Local and metropolitan area networks—Specific requirements, Part 11: Wireless LAN Medium Access Control (MAC) and Physical Layer (PHY) specifications: Amendment 4: Enhancements for Very High Throughput for Operation in Bands below 6 GHz," *The Institute of Electrical and Electronics Engineers, Inc.*, pp. 1-446 (Jul. 2013).

IEEE Std 802.11ac/D7.0 "Draft Standard for Information Technology—Telecommunications and information exchange between systems—Local and metropolitan area networks—Specific requirements, Part 11: Wireless LAN Medium Access Control (MAC) and Physical Layer (PHY) specifications: Amendment 4: Enhancements for Very High Throughput for Operation in Bands below 6 GHz," *The Institute of Electrical and Electronics Engineers, Inc.*, pp. 1-456 (Sep. 2013).

IEEE Std. 802.11n ™"IEEE Standard for Information Technology—Telecommunications and information exchange between systems—Local and metropolitan area networks—Specific requirements, Part 11: Wireless LAN Medium Access Control (MAC) and Physical Layer (PHY) Specifications: Amendment 5: Enhancements for Higher Throughput," *The Institute of Electrical and Electronics Engineers, Inc.*, pp. 1-535 (Oct. 2009).

IEEE Std 802.11™2012 (Revision of IEEE Std 802.11-2007) IEEE Standard for Information technology—Telecommunications and information exchange between systems—Local and metropolitan area networks —Specific requirements Part 11: Wireless LAN Medium Access Control (MAC) and Physical Layer (PHY) specifications, The Institute of Electrical and Electronics Engineers, Inc., pp. 1-2695 (Mar. 29, 2012).

Chun et al. "Legacy Support on HEW frame structure," doc: IEEE 11-13/1057r0, *The Institute of Electrical and Electronics Engineers, Inc.*, pp. 1-8 (Sep. 2013).

Perahia et al., "Gigabit Wireless LANs: an overview of IEEE 802.11ac and 80211ad," ACM SIGMOBILE Mobile Computing and Communications Review, vol. 15, No. 3, pp. 23-33 (Jul. 2011).

Stacey et al., "IEEE P802.11, Wireless LANs, Proposed TGac Draft Amendment," Institute of Electrical and Electronics Engineers, doc. No. IEEE 802.11-10/1361r3 pp. 1-154 (Jan. 2011).

Stacey et al., "Specification Framework for TGac," document No. IEEE 802.11-09/0992r20, *Institute for Electrical and Electronics Engineers*, pp. 1-49, (Jan. 18, 2011).

van Nee et al., "The 802.11n MIMO-OFDM Standard for Wireless LAN and Beyond," Wireless Personal Communications, vol. 37, pp. 445-453 (Jun. 2006).

\* cited by examiner

METHOD AND APPARATUS FOR GENERATING A PHY DATA UNIT

CROSS-REFERENCES TO RELATED APPLICATIONS

This disclosure claims the benefit of U.S. Provisional Patent Application No. 62/062,301, filed Oct. 10, 2014, entitled "Preamble Reliability Improvement Based on CRC Across Fields," which is hereby incorporated by reference herein in its entirety.

FIELD OF THE DISCLOSURE

The present disclosure relates generally to communication networks and, more particularly, to physical layer (PHY) data units transmitted in communication networks.

BACKGROUND

Wireless local area networks (WLANs) have evolved rapidly over the past decade. Development of WLAN standards such as the Institute for Electrical and Electronics Engineers (IEEE) 802.11a, 802.11b, 802.11g, and 802.11n Standards has improved single-user peak data throughput. For example, the IEEE 802.11b Standard specifies a single-user peak throughput of 11 megabits per second (Mbps), the IEEE 802.11a and 802.11g Standards specify a single-user peak throughput of 54 Mbps, the IEEE 802.11n Standard specifies a single-user peak throughput of 600 Mbps, and the IEEE 802.11ac Standard specifies a single-user peak throughput in the gigabits per second (Gbps) range. Future standards promise to provide even greater throughput, such as throughputs in the tens of Gbps range.

SUMMARY

In an embodiment, a method includes generating, at a communication device, a first portion of a physical layer (PHY) preamble, wherein the PHY preamble is defined by a first wireless communication protocol, and the first portion corresponds to a legacy PHY preamble defined by a second wireless communication protocol, the second wireless communication protocol being a legacy protocol. The method also includes generating, at the communication device, error detection information using a first field in the first portion of the PHY preamble. The method further includes generating, at the communication device, a second portion of the PHY preamble, wherein the second portion is not defined by the second wireless communication protocol, and wherein generating the second portion of the PHY preamble comprises including the error detection information in a second field in the second portion of the PHY preamble. Additionally, the method includes generating, at the communication device, a PHY data unit so that the PHY data unit includes the PHY preamble, wherein the PHY data unit conforms to the first wireless communication protocol.

In another embodiment, an apparatus comprises a network interface device having one or more integrated circuits configured to generate a first portion of a physical layer (PHY) preamble, wherein the PHY preamble is defined by a first wireless communication protocol, and the first portion corresponds to a legacy PHY preamble defined by a second wireless communication protocol, the second wireless communication protocol being a legacy protocol. The one or more integrated circuits are further configured to generate error detection information using a first field in the first portion of the PHY preamble, and generate a second portion of the PHY preamble. The second portion is not defined by the second wireless communication protocol, and generating the second portion of the PHY preamble comprises including the error detection information in a second field in the second portion of the PHY preamble. The one or more integrated circuits are further configured to generate a PHY data unit so that the PHY data unit includes the PHY preamble, wherein the PHY data unit conforms to the first wireless communication protocol.

In yet another embodiment, a method includes: receiving, at a communication device, a physical layer (PHY) data unit having a PHY preamble. The PHY preamble is defined by a first wireless communication protocol, and a first portion of the PHY preamble corresponds to a legacy PHY preamble defined by a second wireless communication protocol, the second wireless communication protocol being a legacy protocol. The method also includes generating, at the communication device, first error detection information using information in a first field in the first portion of the PHY preamble. The method further includes comparing, at the communication device, the first error detection information with corresponding second error detection information in a second field in a second portion of the PHY preamble, wherein the second portion is not defined by the second wireless communication protocol. Additionally, the method includes determining, at the communication device, whether there is an error in the information in the first field in the first portion of the PHY preamble based on the comparison.

In still another embodiment, an apparatus comprises a network interface device having one or more integrated circuits configured to receive a physical layer (PHY) data unit having a PHY preamble. The PHY preamble is defined by a first wireless communication protocol, and a first portion of the PHY preamble corresponds to a legacy PHY preamble defined by a second wireless communication protocol, the second wireless communication protocol being a legacy protocol. The one or more integrated circuits are also configured to generate first error detection information using information in a first field in the first portion of the PHY preamble. The one or more integrated circuits are also configured to compare the first error detection information with corresponding second error detection information in a second field in a second portion of the PHY preamble, wherein the second portion is not defined by the second wireless communication protocol. Additionally, the one or more integrated circuits are configured to determine whether there is an error in the information in the first field in the first portion of the PHY preamble based on the comparison.

DETAILED DESCRIPTION

In embodiments described below, a communication device such as an access point (AP) or a client of a communication network (e.g., a wireless local area network (WLAN)) transmits and receives signals with one or more other communication device in the communication network. The communication device is configured to communicate with other communication devices according to at least a first communication protocol. The first communication protocol is sometimes referred to herein as "high efficiency WiFi," "HEW" communication protocol, "HE" communication protocol, or IEEE 802.11ax communication protocol. In some embodiments, the communication device is configured to generate and transmit physical layer (PHY) data units according to the first communication protocol; and is configured to receive PHY data units that were generated and transmitted by other communication devices according to the first communication protocol.

In some embodiments, a PHY data unit generated according to the first communication protocol includes a PHY preamble having a first portion that corresponds to a legacy PHY preamble defined by a second communication protocol. The second communication protocol is a legacy communication protocol with respect to the first communication protocol, according to an embodiment. In some embodiments, the first portion of the PHY preamble facilitates coexistence with legacy devices (e.g., communication devices that are configured to operate according to the second communication protocol, but not the first communication protocol). For example, in some embodiments, the first portion of the PHY preamble of a PHY data unit is configured so that legacy devices can detect the PHY data unit and determine (at least approximately) a length of the PHY data unit using information contained in the first portion. Thus, legacy devices can "back off" until transmission of the PHY data unit is completed, thus avoiding a "collision" between the PHY data unit and a transmission by a legacy device.

In some embodiments, error detection information for information contained in the first portion of the PHY preamble is generated and included in a second portion of the PHY preamble that is defined by the first communication protocol. In some embodiments, presence of the error detection information in the PHY preamble improves the reliability of the information contained in the first portion of the PHY preamble, such as information indicating a length of the PHY data unit. Thus, devices that comply with the first communication protocol can more reliably determine the length of the PHY data unit based on the information in the first portion of the PHY preamble.

Figure 1:
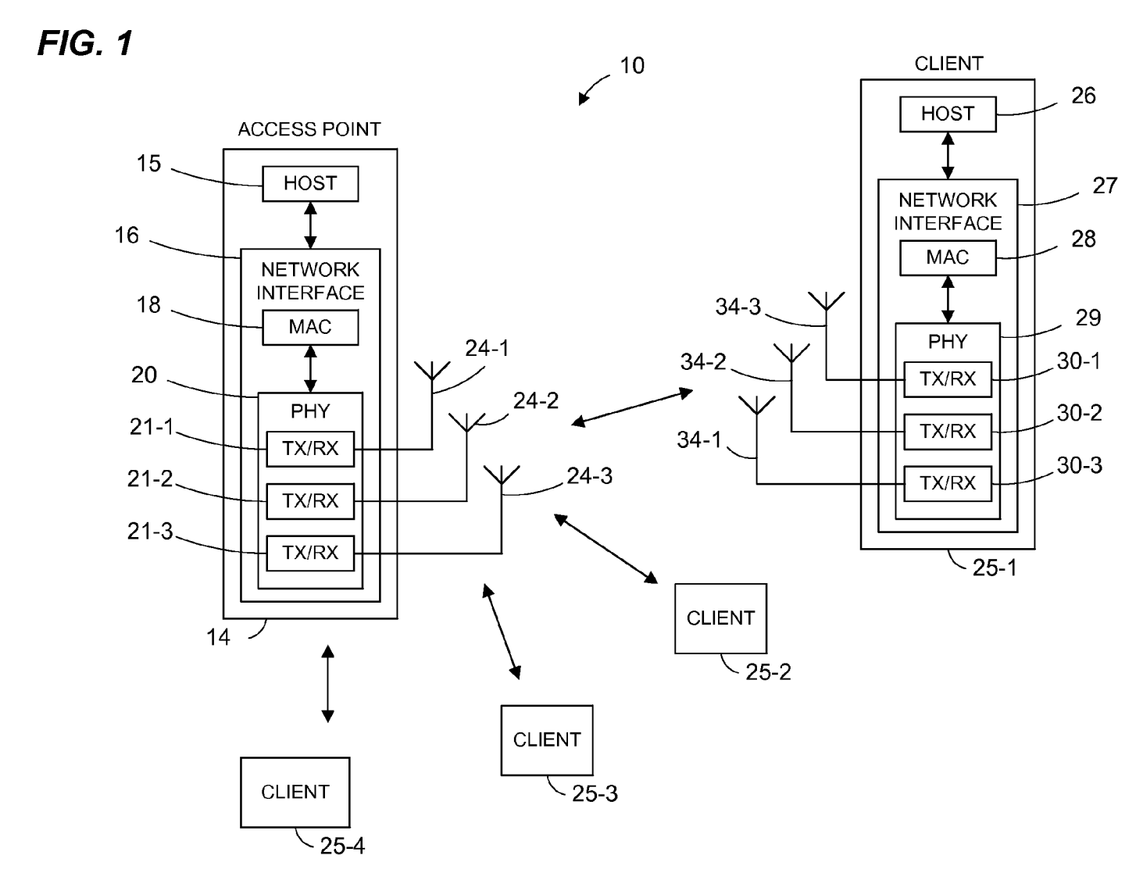
FIG. 1 is a block diagram of an example wireless local area network (WLAN), according to an embodiment.

FIG. 1 is a block diagram of an example wireless local area network (WLAN) 10, according to an embodiment. The WLAN 10 supports multiple-input and multiple-output (MIMO) communication between an access point (AP) and a plurality of client stations. The WLAN 10 includes an AP 14, and the AP 14, in turn, includes a host processor 15 coupled to a network interface device 16. The network interface device 16 includes a medium access control (MAC) processing unit 18 and a physical layer (PHY) processing unit 20. The PHY processing unit 20 includes a plurality of transceivers 21, and the transceivers 21 are coupled to a plurality of antennas 24. Although three transceivers 21 and three antennas 24 are illustrated in FIG. 1, the AP 14 includes other suitable numbers (e.g., 1, 2, 4, 5, etc.) of transceivers 21 and antennas 24 in other embodiments. In one embodiment, the MAC processing unit 18 and the PHY processing unit 20 are configured to operate according to a first communication protocol (e.g., the HE communication protocol). In various embodiments, the network interface device 16 is implemented on one more integrated circuit (IC) devices.

The WLAN 10 includes a plurality of client stations 25. Although four client stations 25 are illustrated in FIG. 1, the WLAN 10 includes other suitable numbers (e.g., 1, 2, 3, 5, 6, etc.) of client stations 25 in various scenarios and embodiments. At least one of the client stations 25 (e.g., client station 25-1) is configured to operate at least according to the first communication protocol. In some embodiments, at least one of the client stations 25 (referred to herein as a "legacy client station") is not configured to operate according to the first communication protocol, but is configured to operate according to a second communication protocol, where the second communication is a legacy protocol with respect to the first communication protocol.

The client station 25-1 includes a host processor 26 coupled to a network interface device 27. The network interface device 27 includes a MAC processing unit 28 and a PHY processing unit 29. The PHY processing unit 29 includes a plurality of transceivers 30, and the transceivers 30 are coupled to a plurality of antennas 34. Although three transceivers 30 and three antennas 34 are illustrated in FIG. 1, the client station 25-1 includes other suitable numbers (e.g., 1, 2, 4, 5, etc.) of transceivers 30 and antennas 34 in other embodiments. In various embodiments, the network interface device 27 is implemented on one more IC devices.

According to an embodiment, the client station 25-4 is a legacy client station, i.e., the client station 25-4 is not enabled to receive and fully decode a data unit that is transmitted by the AP 14 or another client station 25 according to the first communication protocol. Similarly, according to an embodiment, the legacy client station 25-4 is not enabled to transmit data units according to the first communication protocol. On the other hand, the legacy client station 25-4 is enabled to receive and fully decode and transmit data units according to the second communication protocol.

In an embodiment, one or both of the client stations 25-2 and 25-3, has a structure the same as or similar to the client station 25-1. In an embodiment, the client station 25-4 has a structure similar to the client station 25-1. In these embodiments, the client stations 25 structured the same as or similar to the client station 25-1 have the same or a different number of transceivers and antennas. For example, the client station 25-2 has only two transceivers and two antennas, according to an embodiment.

In various embodiments, the PHY processing unit 20 of the AP 14 is configured to generate data units conforming to the first communication protocol and having formats described herein. The transceiver(s) 21 is/are configured to transmit the generated data units via the antenna(s) 24. Similarly, the transceiver(s) 24 is/are configured to receive such data units via the antenna(s) 24. The PHY processing unit 20 of the AP 14 is configured to process received data units conforming to the first communication protocol and having formats described herein and to determine that such data units conform to the first communication protocol, according to various embodiments.

In various embodiments, the PHY processing unit 29 of the client device 25-1 is configured to generate data units conforming to the first communication protocol and having formats described herein. The transceiver(s) 30 is/are configured to transmit the generated data units via the antenna(s) 34. Similarly, the transceiver(s) 30 is/are configured to receive such data units via the antenna(s) 34. The PHY processing unit 29 of the client device 25-1 is configured to process received data units conforming to the first communication protocol and having formats described hereinafter and to determine that such data units conform to the first communication protocol, according to various embodiments.

Figure 2:
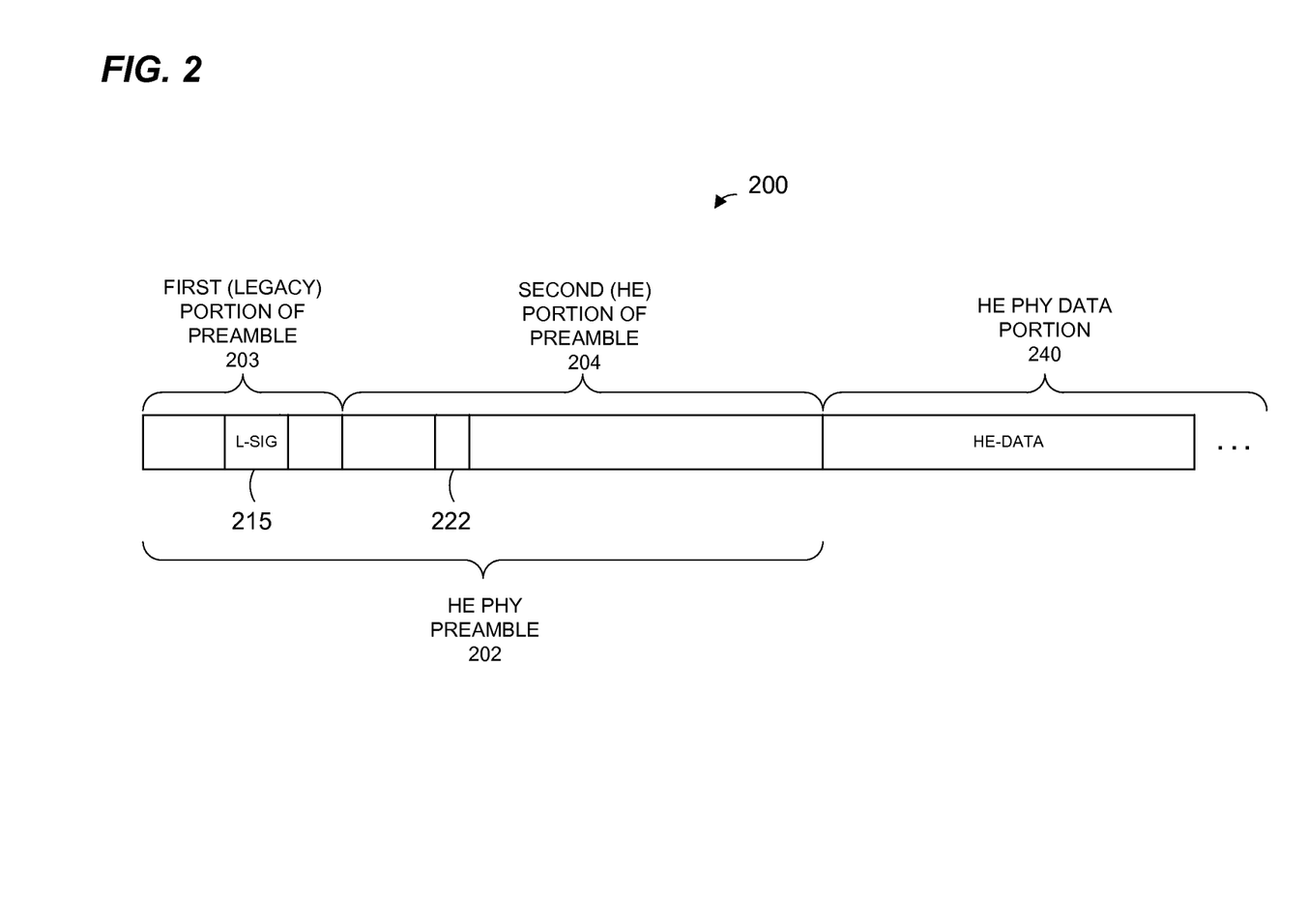
FIG. 2 is a diagram of an example physical layer (PHY) data unit having error detection information corresponding to a field in a legacy portion of a PHY preamble of the PHY data unit, according to an embodiment.

FIG. 2 is a diagram of a physical layer (PHY) data unit 200 that the AP 14 is configured to transmit to one or more client stations 25 that operate according to the first communication protocol (e.g., the client stations 25-1) using orthogonal frequency division multiplexing (OFDM) transmission, according to an embodiment. In an embodiment, one or more client stations 25 that operate according to the first communication protocol (e.g., the client station 25-1) are also configured to transmit data units the same as or similar to the data unit 200 to the AP 14 (or to another client station). The data unit 200 conforms to the first communication protocol and occupies a 20 MHz bandwidth. Data units similar to the data unit 200 occupy other suitable bandwidths such as 40 MHz, 80 MHz, 160 MHz, 320 MHz, 640 MHz, for example, or other suitable bandwidths, in other embodiments.

The data unit 200 includes a PHY preamble 202. The preamble 202 includes a first portion 203 that corresponds to a PHY preamble specified by the second (legacy) communication protocol. The preamble 202 also includes a second portion 204 that conforms to the first communication protocol (e.g., the HE protocol). The first portion 203 includes a legacy signal field (L-SIG) 215.

In some embodiments, the data unit 200 also includes a data portion 240. In some embodiments and/or scenarios, the data unit 200 omits the data portion 240 (e.g., when used for training, channel measurement, etc.).

In the embodiment of FIG. 2, the data unit 200 includes one L-SIG 215. In other embodiments in which a data unit similar to the data unit 200 occupies a cumulative bandwidth other than 20 MHz, the first portion 203 (including the L-SIG 215) is repeated over a corresponding number of 20 MHz sub-bands of the whole bandwidth of the data unit, in an embodiment. For example, in an embodiment in which the data unit occupies an 80 MHz bandwidth, the data unit includes four preamble portions 203 (e.g., including four L-SIGs 215), one in each of four 20 MHz sub-bands. In some embodiments, the modulation of different 20 MHz sub-bands signals is rotated by different angles. For example, in one embodiment, all OFDM tones within a first subband are rotated 0-degrees (i.e., no rotation), all OFDM tones within a second subband are rotated 90-degrees, a third sub-band is rotated 180-degrees, and a fourth sub-band is rotated 270-degrees. In other embodiments, different suitable rotations are utilized. The different phases of the 20 MHz sub-band signals result in reduced peak to average power ratio (PAPR) of OFDM symbols in such a data unit, in at least some embodiments.

In an embodiment, if the data unit that conforms to the first communication protocol is an OFDM data unit that occupies a cumulative bandwidth such as 40 MHz, 80 MHz, 160 MHz, 320 MHz, 640 MHz, etc., the second portion 204 of the preamble occupies the corresponding whole bandwidth of the data unit.

In an embodiment, the L-SIG 215 includes information about the data unit 200, such as information that indicates a length of the data unit 200, in an embodiment. In an embodiment, error detection information is generated using the L-SIG 215. For example, in an embodiment, parity information is generated using the L-SIG 215. As another example, cyclic redundancy check (CRC) information is generated using the L-SIG 215. In some embodiments, the error detection information also serves as error correction information. For example, in some embodiments, error correction information is generated using the L-SIG 215. The error correction information may enable correction, at a receiver device, of errors in the L-SIG 215 caused by noise, interference, etc., in a communication channel, at least in some circumstances.

The error detection information generated using the L-SIG 215 is included in a field 222 of the second portion 204 of the PHY preamble 202.

In some embodiments, the error detection information is generated also using information in one or more fields in the second portion 204 of the PHY preamble 202. For example, in some embodiments, the error detection information is generated also using information in one or more signal fields in the second portion 204 of the PHY preamble 202.

In some embodiments, error detection information generated using information in the L-SIG 215 and another field in the second portion 204 includes applying an error detection information calculation algorithm to the L-SIG 215 and the other field in the second portion 204. For example, in an embodiment, a CRC polynomial is applied to the L-SIG 215 and the other field in the second portion 204.

In some embodiments, generating error detection information using information in the L-SIG 215 and another field in the second portion 204 includes generating a first subset of the error detection information using information in the L-SIG 215 and generating a second subset of the error detection information using information in the other field in the second portion 204. In some embodiments, the first subset and the second subset are combined to generate combined error detection information, and the combined error detection information is then included in the field 222. For example, in an embodiment, the first subset is concatenated with the second subset. In another example, in an embodiment, the first subset is exclusive-ORed with the second subset.

In some embodiments, the error detection information is generated also using i) information in a first signal field in the second portion 204 of the PHY preamble 202 and ii) information in a second signal field in the second portion 204 of the PHY preamble 202.

In some embodiments, error detection information generated using information in the L-SIG 215 and multiple other fields in the second portion 204 includes applying an error detection information calculation algorithm to the L-SIG 215 and the multiple other fields in the second portion 204. For example, in an embodiment, a CRC polynomial is applied to i) the L-SIG 215, ii) a first signal field in the second portion 204, and iii) a second signal field in the second portion 204.

In some embodiments, generating error detection information includes i) generating a first subset of the error detection information using information in the L-SIG 215, ii) generating a second subset of the error detection information using information in the first other field (e.g., a first signal field) in the second portion 204, and iii) generating a third subset of the error detection information using information in the second other field (e.g., a second signal field) in the second portion 204. In some embodiments, the first subset, the second subset, and the third subset are combined to generate combined error detection information, and the combined error detection information is then included in the field 222. For example, in an embodiment, the first subset, the second subset, and the third subset are concatenated. In another example, in an embodiment, the first subset, the second subset, and the third subset are exclusive-ORed.

Figure 3:
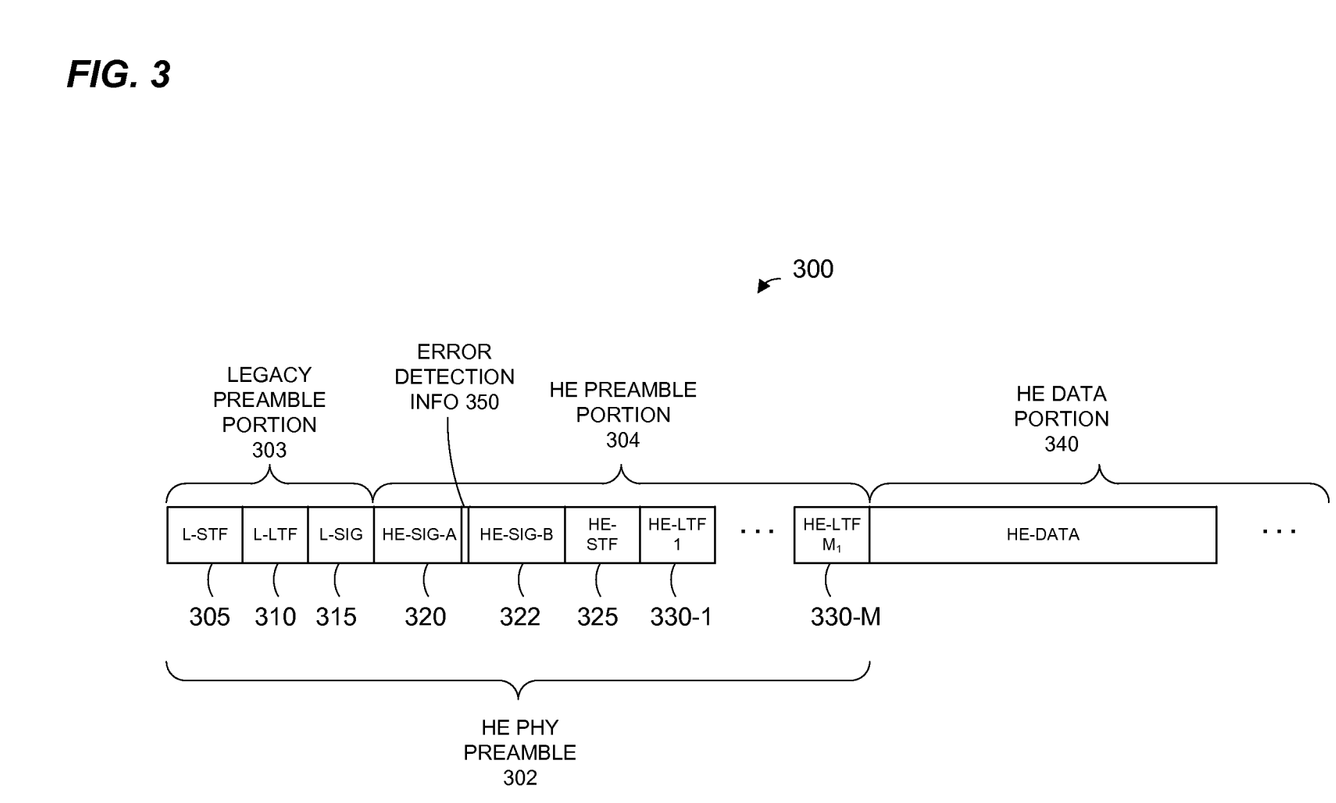
FIG. 3 is a diagram of another example PHY data unit having error detection information corresponding to a field in a legacy portion of a PHY preamble of the PHY data unit, according to another embodiment.

FIG. 3 is a diagram of a physical layer (PHY) data unit 300 that the AP 14 is configured to transmit to one or more client stations 25 (e.g., the client stations 25-1) using OFDM transmission, according to an embodiment. In an embodiment, one or more client stations 25 (e.g., the client stations 25-1) are also configured to transmit data units the same as or similar to the data unit 300 to the AP 14. The data unit 300 conforms to the HE communication protocol and occupies a 20 MHz bandwidth. Data units similar to the data unit 300 occupy other suitable bandwidth such as 40 MHz, 80 MHz, 160 MHz, 320 MHz, 640 MHz, for example, or other suitable bandwidths, in other embodiments.

The data unit 300 includes a PHY preamble including a legacy short training field (L-STF) 305, a legacy long training field (L-LTF) 310, an L-SIG 315, a first HE signal field (HE-SIG-A) 320, a second HE signal field (HE-SIG-B) 322, an HE short training field (HE-STF) 325, and M HE long training fields (HE-LTFs) 330, where M is an integer. In some embodiments and/or scenarios, the PHY preamble 302 omits one or more of the fields 305-335. For example, the preamble 302 omits one of the HE-SIG-A 320 or the HE-SIG-B 322. In some embodiments, the preamble 302 includes additional fields not illustrated in FIG. 3. For example, in some embodiments, the PHY preamble 302 includes a third HE signal field (HE-SIG-C) after the HE-LTFs 330 or at another suitable location in the preamble 302.

In some embodiments, the data unit 300 also includes a data portion 340. In some embodiments and/or scenarios, the data unit 300 omits the data portion 340 (e.g., when used for training, channel measurement, etc.).

Each of the L-STF 305, the L-LTF 310, the L-SIG 315, the HE-SIG-A 320, the HE-SIG-B 322, the HE-STF 325, and the M HE-LTFs 230 comprises an integer number of one or more OFDM symbols. As merely an example, in an embodiment, the HE-SIG-A 320 comprises only two OFDM symbols, and the HE-SIG-B 322 comprises only one OFDM symbol. As merely another example, in another embodiment, the HE-SIG-A 320 comprises only one OFDM symbol, and the HE-SIG-B comprises only two OFDM symbols.

In the embodiment of FIG. 3, the data unit 300 includes one of each of the L-STF 305, the L-LTF 310, the L-SIG 215, the HE-SIG-A 320, and the HE-SIG-B 335. In other embodiments in which a data unit similar to the data unit 300 occupies a cumulative bandwidth greater than 20 MHz, each of the L-STF 305, the L-LTF 310, the L-SIG 315, the HE-SIG-A 32, and the HE-SIG-B 3350 is repeated over a corresponding number of 20 MHz sub-bands of the whole bandwidth of the data unit, in an embodiment. For example, in an embodiment, the data unit occupies an 80 MHz bandwidth and, accordingly, includes four of each of the L-STF 305, the L-LTF 310, the L-SIG 315, the HE-SIG-A 320, and the HE-SIG-B 335. In some embodiments, the modulation of different 20 MHz sub-bands signals is rotated by different angles. For example, in one embodiment, all OFDM tones within a first subband are rotated 0-degrees, all OFDM tones within a second subband is rotated 90-degrees, a third sub-band is rotated 180-degrees, and a fourth sub-band is rotated 270-degrees. In other embodiments, different suitable rotations are utilized. The different phases of the 20 MHz sub-band signals result in reduced PAPR of OFDM symbols in the data unit 300, in at least some embodiments and/or scenarios. In an embodiment, if the data unit that conforms to the first communication protocol is an OFDM data unit that occupies a cumulative bandwidth such as 20 MHz, 40 MHz, 80 MHz, 160 MHz, 320 MHz, 640 MHz, etc., the HE-STF, the HE-LTFs, and the HE data portion occupy the corresponding whole bandwidth of the data unit.

With continued reference to FIG. 3, each of the HE-SIG-A 320 and the HE-SIG-B 322 generally carries information about the format of the data unit 300, such as information needed to properly decode at least a portion of the data unit 300, in an embodiment. In some embodiments, HE-SIG-A 320 additionally includes information for client stations 25 that are not intended receivers of the data unit 300, such as information needed for medium protection from the client stations 25 that are not intended receivers of the data unit 300. On the other hand, HE-SIG-B 322 carries user-specific information individually needed by each client station 25 that is an intended recipient of the data unit 300, in an embodiment. In an embodiment, HE-SIG-A 320 includes information needed to properly decode HE-SIG-B 322, and HE-SIG-B 322 includes information needed to properly decode data streams in the data portion 340 of the data unit 300, in an embodiment. In some embodiments and/or scenarios, however, HE-SIG-A field 320 includes at least some of the information needed to decode the data portion 340. In at least some embodiments and scenarios in which the AP 14 is the intended recipient of the data unit 300 (i.e., when the data unit 300 is an uplink data unit), information needed to properly decode the data portion 340 of the data unit 300 is known a priori by the intended recipient of the data unit 300 and need not be included in the preamble of the data unit 300. In some such embodiments, the HE-SIG-B 322 is omitted from the data unit 300.

In an embodiment, the L-SIG 315 includes information about the data unit 300, such as information that indicates a length of the data unit 300, in an embodiment. In an embodiment, error detection information is generated using the L-SIG 315. For example, in an embodiment, parity information is generated using the L-SIG 315. As another example, CRC information is generated using the L-SIG 315. In some embodiments, the error detection information also serves as error correction information. For example, in some embodiments, error correction information is generated using the L-SIG 315. The error correction information may enable correction, at a receiver device, of errors in the L-SIG 315 caused by noise, interference, etc., in a communication channel, at least in some circumstances.

The error detection information generated using the L-SIG 315 is included in a subfield 350 of the HE-SIGA 320, in an embodiment.

In some embodiments, the error detection information is generated also using information in the HE-SIGA 320. In some embodiments, error detection information generated using information in the L-SIG 315 and the HE-SIGA 320 includes applying an error detection information calculation algorithm to information in the L-SIG 215 and information in the HE-SIGA 320. For example, in an embodiment, a CRC polynomial is applied to information in the L-SIG 315 and information in the HE-SIGA 320.

In some embodiments, generating error detection information using information in the L-SIG 315 and the HE-SIGA 320 includes generating a first subset of the error detection information using information in the L-SIG 315 and generating a second subset of the error detection information using information in the HE-SIGA 320. In some embodiments, the first subset and the second subset are combined to generate combined error detection information, and the combined error detection information is then included in the subfield 350. For example, in an embodiment, the first subset is concatenated with the second subset. In another example, in an embodiment, the first subset is exclusive-ORed with the second subset.

In an illustrative embodiment, the HE-SIGA 320 includes 24 bits as set forth in Table 1.

TABLE 1

| Subfield Name | Number of bits |
| --- | --- |
| Bandwidth | 2 |
| Color bits for BSS ID | 6 |
| CRC | 1 parity bit, or 2-8 CRC bits |
| CP Length | 2 |
| Tail | 4-6 |
| Other usage and/or reserved | 2-7 |

In other embodiments, the HE-SIGA 320 includes a different suitable number of bits, different suitable information, and/or different suitable numbers of bits for the subfields. Additionally or alternatively, in other embodiments, the HE-SIGA 320 may omit one or more of the bandwidth subfield, the color subfield, the CP length subfield, the tail subfield, and/or reserved bits.

In some embodiments in which the error detection information corresponds to a CRC, a CRC generation algorithm is utilized to generate a first number of CRC bits, and then the CRC bits are truncated to generate the error detection information that is included in the subfield 350. For example, in an embodiment, a suitable algorithm for generating an 8-bit CRC is generated, and then the 8-bit CRC is truncated to a suitable smaller number of bits such as 7 bits, 6 bits, 5 bits, 4 bits, 3 bits, or 2 bits. In an illustrative embodiment, an 8-bit CRC is generated, and then the 8-bit CRC is truncated to 4 bits by removing the 4 least significant bits (LSBs) of the 8-bit CRC. In another illustrative embodiment, an 8-bit CRC is generated, and then the 8-bit CRC is truncated to 4 bits by removing the 4 most significant bits (MSBs) of the 8-bit CRC.

Figure 4:
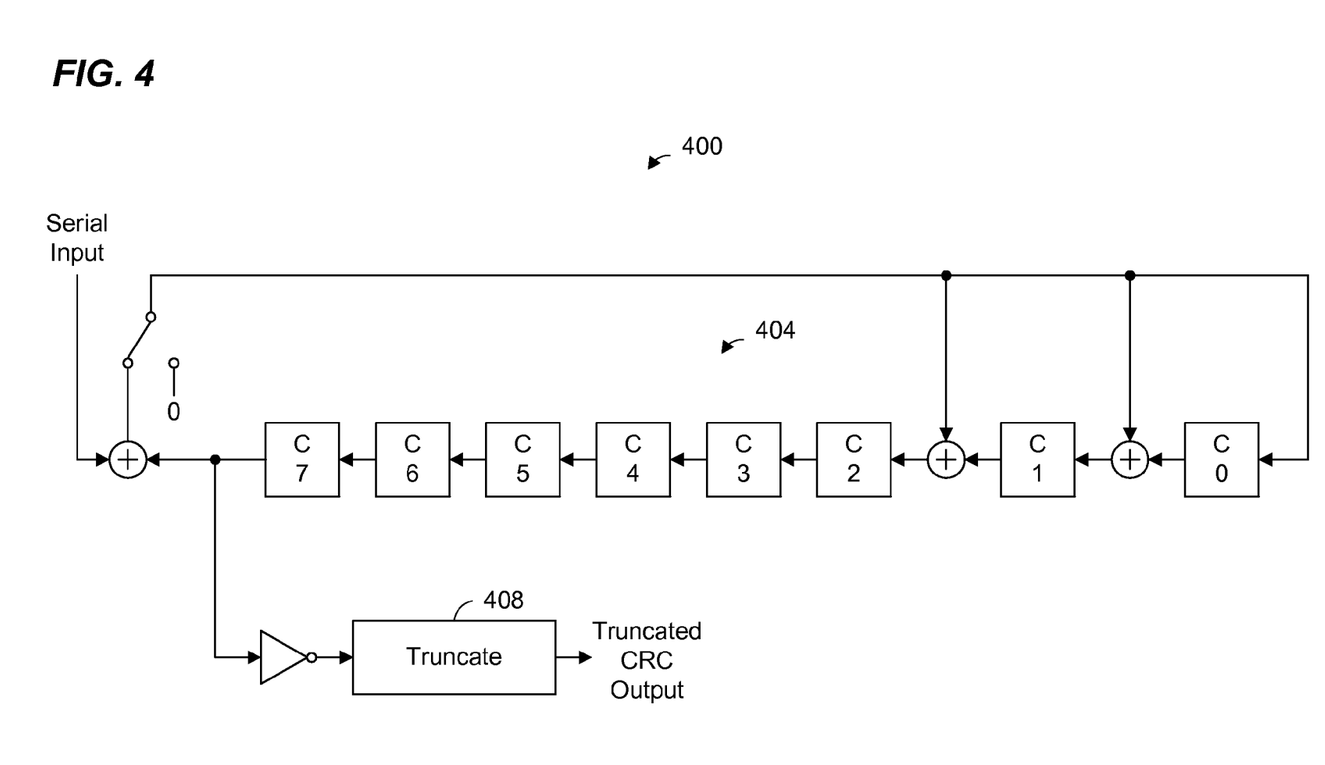
FIG. 4 is a diagram of an example technique for generating error detection information corresponding to a field in a legacy portion of a PHY preamble of a PHY data unit, according to another embodiment.

FIG. 4 is a block diagram of an example error detection information generator 400 that is utilized in some embodiments. The error detection information generator 400 is similar to the 8-bit CRC generator utilized in the IEEE 802.11n Standard, but involves truncation to 4 bits, as is explained further below.

The error detection information generator 400 includes a serial input to an 8-bit CRC generator 404. A truncate block 408 truncates an output of the CRC generator 404. In an embodiment, bits from the L-SIG 315 are sequentially provided to the serial input. In another embodiment, bits from the L-SIG 315 and bits from the HE-SIGA 320 are sequentially provided to the serial input. In an embodiment, a feedback term is set to zero while an 8-bit CRC result is shifted out of the CRC generator 404. In an embodiment, the truncate block 408 removes the 4 LSBs from the 8-bit CRC result. In another embodiment, the truncate block 408 removes the 4 MSBs from the 8-bit CRC result. An output of the truncate block 408 is then included in the subfield 350 (FIG. 3), as an illustrative embodiment.

In an embodiment, the CRC generator 404 utilizes the following polynomial:

$$G(D)=D^8+D^2+D+1$$

In other embodiments, other suitable polynomials are utilized.

Figure 5:
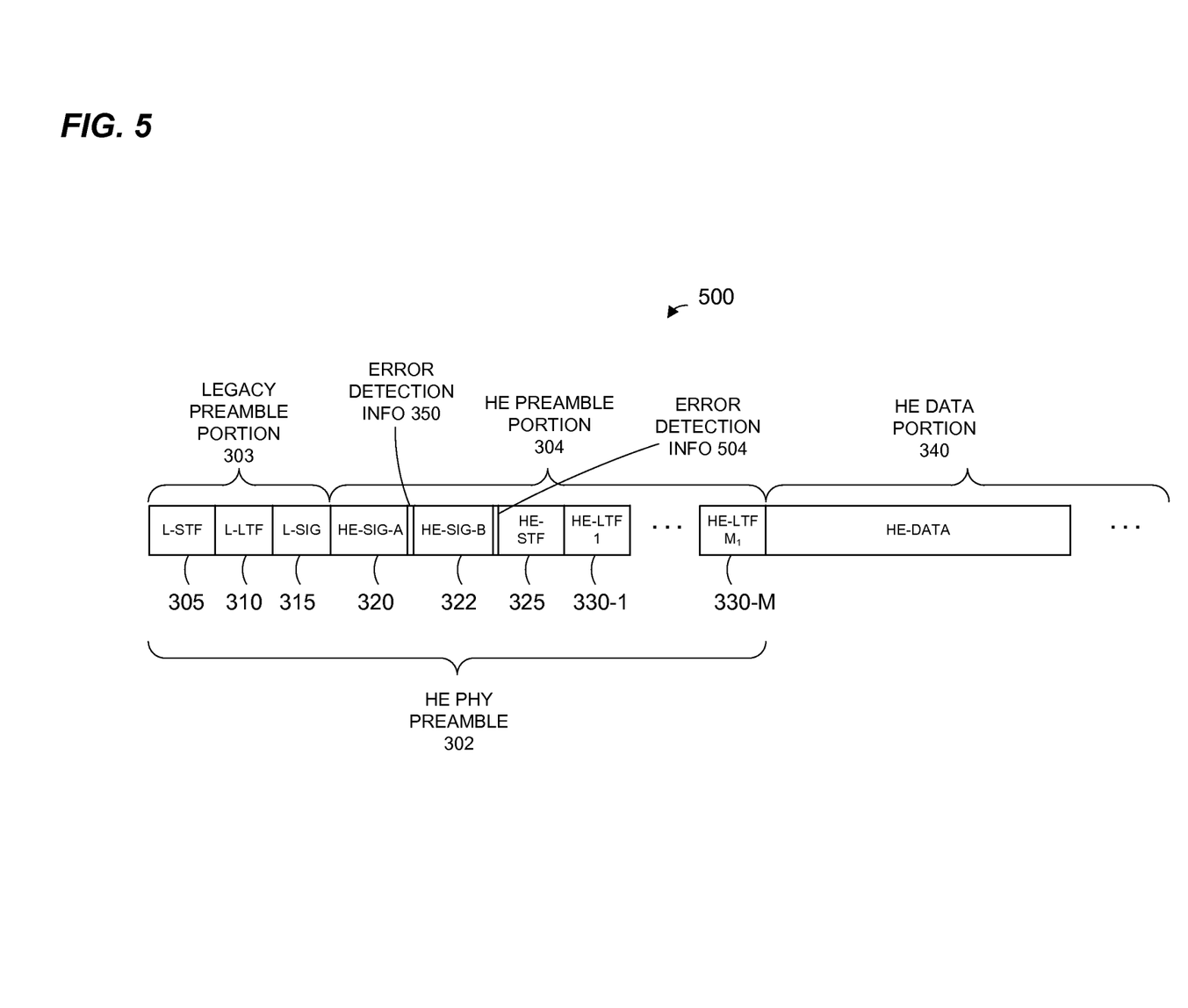
FIG. 5 is a diagram of yet another example PHY data unit having error detection information corresponding to a field in a legacy portion of a PHY preamble of the PHY data unit, according to another embodiment.

FIG. 5 is a diagram of another example PHY data unit 500, according to an embodiment. The example data unit 500 is similar to the data unit 300 of FIG. 3, and like-numbered elements are not discussed in detail for purposes of brevity. Referring also to FIG. 1, the AP 14 is configured to transmit data units the same as or similar to the data unit 500 to one or more client stations 25 (e.g., the client stations 25-1) using OFDM transmission, according to an embodiment. In an embodiment, one or more client stations 25 (e.g., the client stations 25-1) are also configured to transmit data units the same as or similar to the data unit 500 to the AP 14.

In an embodiment, error detection information is generated using information in the HE-SIGB 322. For example, in an embodiment, parity information is generated using information in the HE-SIGB 322. As another example, CRC information is generated using information in the HE-SIGB 322. In some embodiments, the error detection information also serves as error correction information. For example, in some embodiments, error correction information is generated using information in the HE-SIGB 322. The error correction information may enable correction, at a receiver device, of errors in the HE-SIGB 322 caused by noise, interference, etc., in a communication channel, at least in some circumstances.

The error detection information generated using information in the HE-SIGB 322 is included in a subfield 504 of the HE-SIGB 322, in an embodiment.

Figure 6:
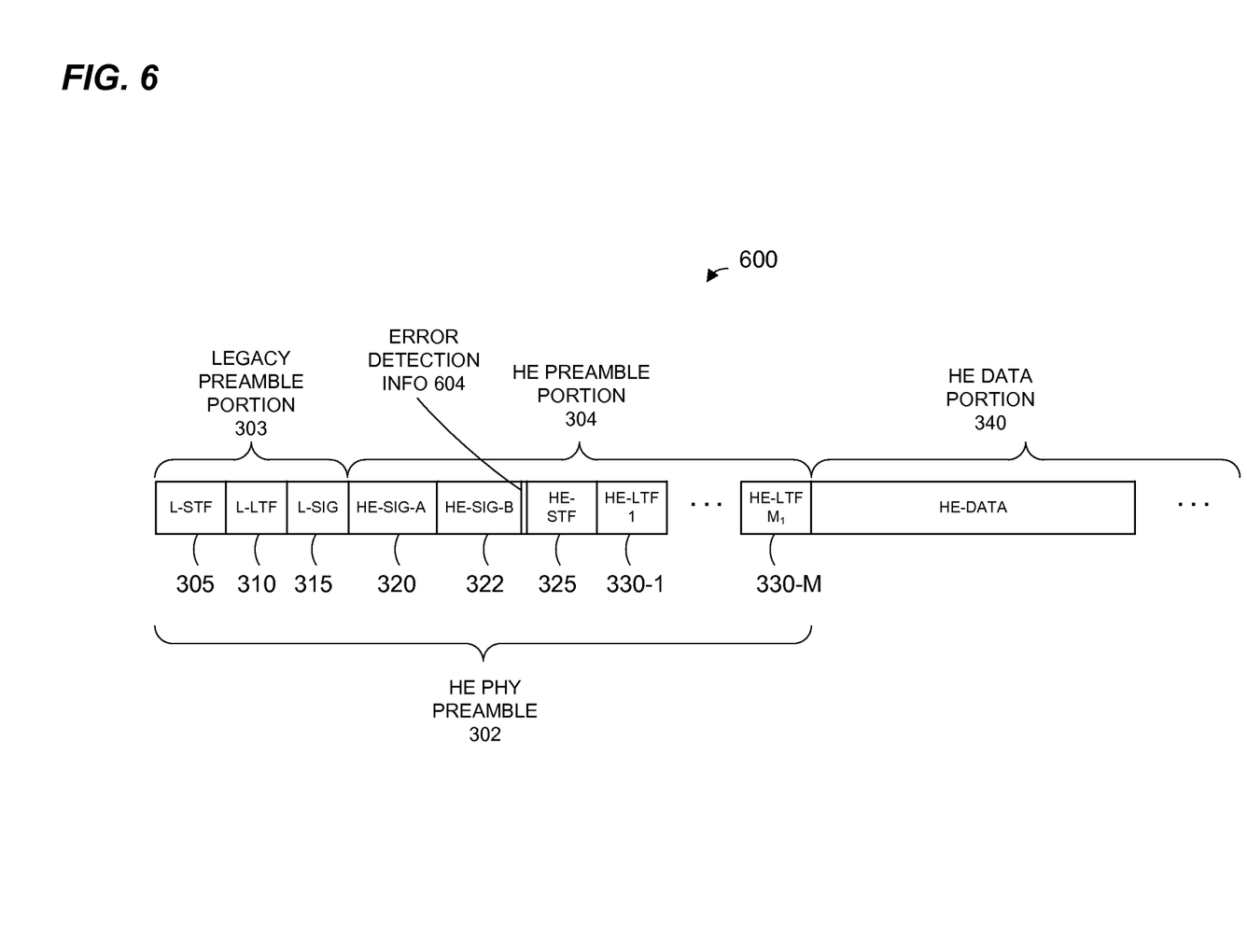
FIG. 6 is a diagram of still another example PHY data unit having error detection information corresponding to a field in a legacy portion of a PHY preamble of the PHY data unit, according to another embodiment.

FIG. 6 is a diagram of another example PHY data unit 600, according to an embodiment. The example data unit 600 is similar to the data unit 300 of FIG. 3, and like-numbered elements are not discussed in detail for purposes of brevity. Referring also to FIG. 1, the AP 14 is configured to transmit data units the same as or similar to the data unit 600 to one or more client stations 25 (e.g., the client stations 25-1) using OFDM transmission, according to an embodiment. In an embodiment, one or more client stations 25 (e.g., the client stations 25-1) are also configured to transmit data units the same as or similar to the data unit 600 to the AP 14.

In an embodiment, error detection information is generated using information in the L-SIG 315. For example, in an embodiment, parity information is generated using information in the L-SIG 315. As another example, CRC information is generated using information in the L-SIG 315. In some embodiments, the error detection information also serves as error correction information. For example, in some embodiments, error correction information is generated using information in the L-SIG 315. The error correction information may enable correction, at a receiver device, of errors in the L-SIG 315 caused by noise, interference, etc., in a communication channel, at least in some circumstances.

The error detection information generated using information in the L-SIG 315 is included in a subfield 604 of the HE-SIGB 322, in an embodiment.

In some embodiments, the error detection information is generated also using information in the HE-SIGA 320. In some embodiments, error detection information generated using information in the L-SIG 315 and information in the HE-SIGA 320 includes applying an error detection information calculation algorithm to information in the L-SIG 215 and information in the HE-SIGA 320. For example, in an embodiment, a CRC polynomial is applied to information in the L-SIG 315 and information in the HE-SIGA 320.

In some embodiments, generating error detection information using information in the L-SIG 315 and information in the HE-SIGA 320 includes generating a first subset of the error detection information using information in the L-SIG 315 and generating a second subset of the error detection information using information in the HE-SIGA 320. In some embodiments, the first subset and the second subset are combined to generate combined error detection information, and the combined error detection information is then included in the subfield 604. For example, in an embodiment, the first subset is concatenated with the second subset. In another example, in an embodiment, the first subset is exclusive-ORed with the second subset.

In some embodiments, the error detection information is generated using information in the L-SIG 315 and information in the HE-SIGB 322. In some embodiments, error detection information generated using information in the L-SIG 315 and the HE-SIGB 322 includes applying an error detection information calculation algorithm to information in the L-SIG 215 and information in the HE-SIGB 322. For example, in an embodiment, a CRC polynomial is applied to information in the L-SIG 315 and information in the HE-SIGB 322.

In some embodiments, generating error detection information using information in the L-SIG 315 and information in the HE-SIGB 322 includes generating a first subset of the error detection information using information in the L-SIG 315 and generating a second subset of the error detection information using information in the HE-SIGB 322. In some embodiments, the first subset and the second subset are combined to generate combined error detection information, and the combined error detection information is then included in the subfield 604. For example, in an embodiment, the first subset is concatenated with the second subset. In another example, in an embodiment, the first subset is exclusive-ORed with the second subset.

In some embodiments, the error detection information is generated using information in the L-SIG 315, information in the HE-SIGA 320, and information in the HE-SIGB 322. In some embodiments, error detection information generated using information in the L-SIG 315, information in the HE-SIGA 320, and the HE-SIGB 322 includes applying an error detection information calculation algorithm to information in the L-SIG 215, information in the HE-SIGA 320, and information in the HE-SIGB 322. For example, in an embodiment, a CRC polynomial is applied to information in the L-SIG 315, information in the HE-SIGA 320, and information in the HE-SIGB 322.

In some embodiments, generating error detection information using information in the L-SIG 315, information in the HE-SIGA 320, and information in the HE-SIGB 322 includes generating a first subset of the error detection information using information in the L-SIG 315, generating a second subset of the error detection information using information in the HE-SIGA 320, and generating a third subset of the error detection information using information in the HE-SIGB 322. In some embodiments, the first subset, the second subset, and the third subset are combined to generate combined error detection information, and the combined error detection information is then included in the subfield 604. For example, in an embodiment, the first subset, the second subset, and the third subset are concatenated. In another example, in an embodiment, the first subset, the second subset, and the third subset are exclusive-ORed.

Figure 7:
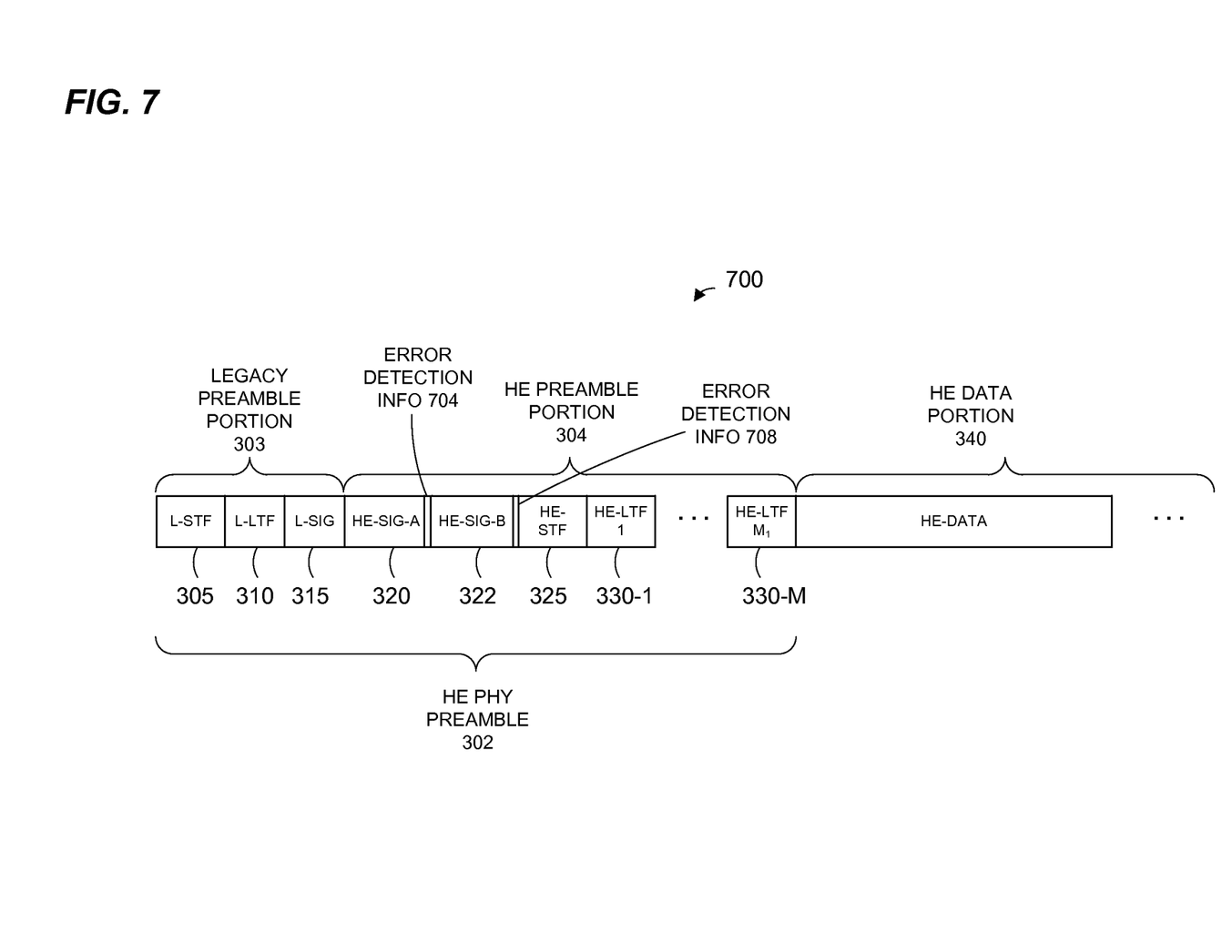
FIG. 7 is a diagram of another example PHY data unit having error detection information corresponding to a field in a legacy portion of a PHY preamble of the PHY data unit, according to another embodiment.

FIG. 7 is a diagram of another example PHY data unit 700, according to an embodiment. The example data unit 700 is similar to the data unit 600 of FIG. 6, and like-numbered elements are not discussed in detail for purposes of brevity. Referring also to FIG. 1, the AP 14 is configured to transmit data units the same as or similar to the data unit 700 to one or more client stations 25 (e.g., the client stations 25-1) using OFDM transmission, according to an embodiment. In an embodiment, one or more client stations 25 (e.g., the client stations 25-1) are also configured to transmit data units the same as or similar to the data unit 700 to the AP 14.

In an embodiment, the error detection information is generated using information in the L-SIG 315, information in the HE-SIGA 320, and information in the HE-SIGB 322. In some embodiments, error detection information generated using information in the L-SIG 315, information in the HE-SIGA 320, and the HE-SIGB 322 includes applying an error detection information calculation algorithm to information in the L-SIG 215, information in the HE-SIGA 320, and information in the HE-SIGB 322. For example, in an embodiment, a CRC polynomial is applied to information in the L-SIG 315, information in the HE-SIGA 320, and information in the HE-SIGB 322.

Then, a first portion of the error detection information is included in a subfield 704 in the HE-SIGA 320, and second portion of the error detection information is included in a subfield 708 in the HE-SIGB 322.

In some embodiments, generating error detection information using information in the L-SIG 315, information in the HE-SIGA 320, and information in the HE-SIGB 322 includes generating a first subset of the error detection information using information in the L-SIG 315, generating a second subset of the error detection information using information in the HE-SIGA 320, and generating a third subset of the error detection information using information in the HE-SIGB 322. In some embodiments, the first subset, the second subset, and the third subset are combined to generate combined error detection information, and the combined error detection information is then included in the subfield 604. For example, in an embodiment, the first subset, the second subset, and the third subset are concatenated. In another example, in an embodiment, the first subset, the second subset, and the third subset are exclusive-ORed.

Then, a first portion of the combined error detection information is included in a subfield 704 in the HE-SIGA 320, and second portion of the combined error detection information is included in a subfield 708 in the HE-SIGB 322.

Referring now to FIGS. 2-7, in some embodiments, the L-SIG 215/315 includes a parity bit, and the error detection information discussed above is in addition to the parity bit in the L-SIG 215/315.

Figure 8:
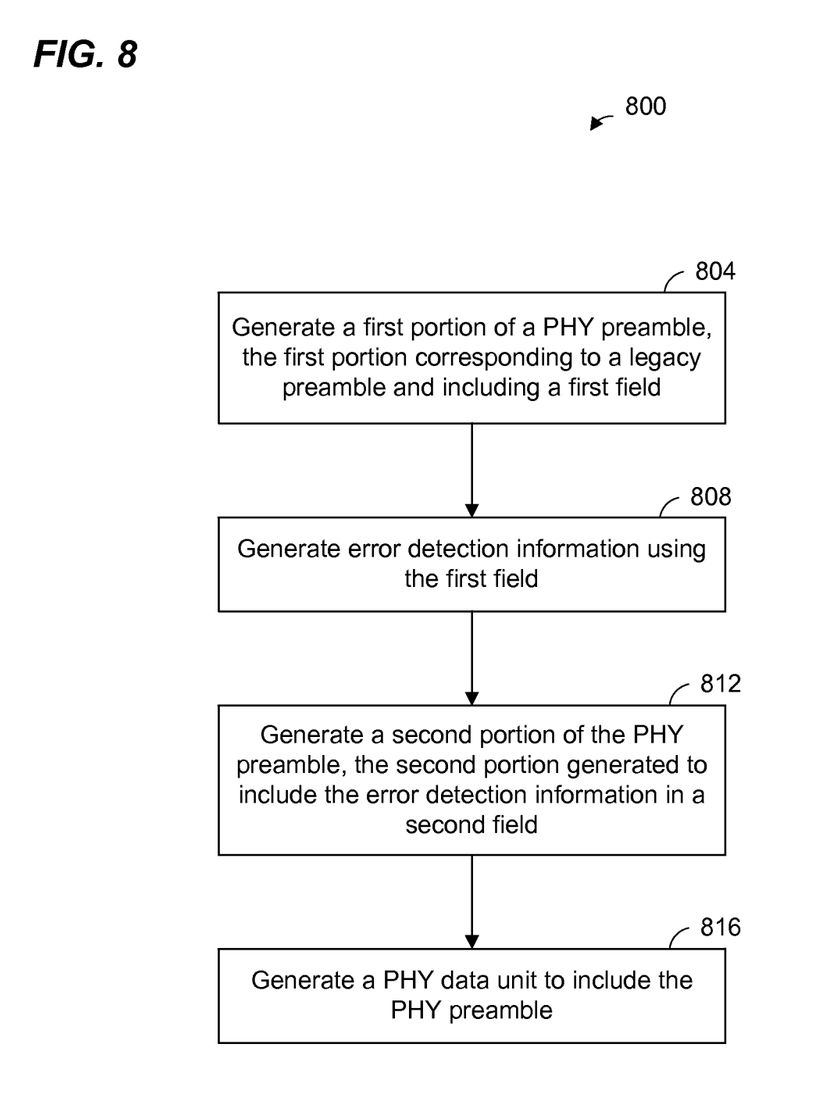
FIG. 8 is a flow diagram of an example method for generating a PHY data unit having error detection information corresponding to a field in a legacy portion of a PHY preamble of the PHY data unit, according to an embodiment.

FIG. 8 is a flow diagram of an example method 800 for generating a PHY data unit, according to an embodiment. With reference to FIG. 1, the method 800 is implemented by the network interface device 16, in an embodiment. For example, in one such embodiment, the PHY processing unit 20 is configured to implement the method 800. According to another embodiment, the MAC processing 18 is also configured to implement at least a part of the method 800. With continued reference to FIG. 1, in yet another embodiment, the method 800 is implemented by the network interface device 27 (e.g., the PHY processing unit 29 and/or the MAC processing unit 28). In other embodiments, the method 800 is implemented by other suitable network interface devices.

At block 804, a first portion of a PHY preamble is generated. In an embodiment, the PHY preamble is defined by a first wireless communication protocol (e.g., the HE protocol). In an embodiment, the first portion corresponds to a legacy PHY preamble defined by a second wireless communication protocol (e.g., a legacy protocol).

In an embodiment, the first portion of the PHY preamble includes a first field. In an embodiment, the first field is defined by the second wireless communication protocol. In an embodiment, the first field is a signal field defined by the second wireless communication protocol. In an embodiment, the first field is an L-SIG field.

At block 808, error detection information is generated using information in the first field in the first portion of the PHY preamble. In some embodiments, error detection information is generated using techniques such as described above, or using other suitable techniques.

At block 812, a second portion of the PHY preamble is generated. In an embodiment, the second portion is generated according to the first wireless communication protocol. In an embodiment, the second portion is not defined by the second wireless communication protocol. In various embodiments, block 812 comprises including the error detection information in one or more second fields in the second portion of the PHY preamble, such as described above.

At block 816, a PHY data unit is generated so that the PHY data unit includes the PHY preamble. In an embodiment, the PHY data unit is generated to conform to the first wireless communication protocol.

A communication device that receives such a PHY data unit utilizes the error detection information in the second portion of the PHY preamble to determine whether information in the first field in the first portion of the PHY preamble is in error. For example, in an embodiment, a network interface device (e.g., such as the network interface device 16 or the network interface device 27 of FIG. 1, or another suitable network interface device) is configured to generate error detection information using information in a received PHY data unit using techniques such as described above. In an embodiment, the network interface device is configured to then compare i) the error detection information generated using information in the received PHY data unit, with ii) the error detection information included in the one or more second fields in the second portion of the PHY preamble. In an embodiment, the network interface device is configured to determine there is an error in the first field in the first portion of the PHY preamble when it is determined that i) the error detection information generated using information in the first portion of the PHY preamble of the received PHY data unit, does not match ii) corresponding error detection information included in the one or more second fields in the second portion of the PHY preamble.

At least some of the various blocks, operations, and techniques described above may be implemented utilizing hardware, a processor executing firmware instructions, a processor executing software instructions, or any combination thereof. When implemented utilizing one or more processors executing software or firmware instructions, the software or firmware instructions may be stored in a tangible, non-transitory medium, or media, such as a magnetic disk, an optical disk, a random access memory (RAM), a read only memory (ROM), a flash memory, a magnetic tape, etc. The software or firmware instructions may include machine readable instructions that, when executed by the one or more processors, cause the one or more processors to perform various acts.

When implemented in hardware, the hardware may comprise one or more of discrete components, one or more integrated circuits (ICs), one or more application-specific integrated circuits (ASICs), etc.

While the present invention has been described with reference to specific examples, which are intended to be illustrative only and not to be limiting of the invention, changes, additions and/or deletions may be made to the disclosed embodiments without departing from the scope of the invention.

What is claimed is:

1. A method implemented by a physical layer (PHY) processing unit of a wireless network interface device, the PHY processing unit configured to generate PHY data units for transmission in a wireless communication network, the method comprising:

generating, at the PHY processing unit, a legacy portion of a physical layer (PHY) preamble, wherein
the PHY preamble is defined by a non-legacy wireless communication protocol, and
the legacy portion corresponds to a legacy PHY preamble defined by a legacy wireless communication protocol, wherein communication devices operating according to the legacy wireless communication protocol are configured to decode the legacy portion;

generating, at the PHY processing unit, error detection information using a first field in the legacy portion of the PHY preamble;

generating, at the PHY processing unit, a non-legacy portion of the PHY preamble, wherein i) communication devices operating according to the non-legacy wireless communication protocol are configured to decode the non-legacy portion and ii) communication devices operating according to the legacy wireless communication protocol are not configured to decode the non-legacy portion, wherein generating the non-legacy portion of the PHY preamble comprises
including the error detection information in a second field in the non-legacy portion of the PHY preamble such that a receiving communication device, operating according to the non-legacy wireless communication protocol, detects an error, when present, in the first field in the legacy portion of the PHY preamble using the error detection information in the second field in the non-legacy portion of the PHY preamble; and generating, at the PHY processing unit, the PHY data unit so that the PHY data unit includes the PHY preamble, wherein the PHY data unit conforms to the non-legacy wireless communication protocol.

2. The method of claim 1, wherein the first field is a legacy signal (L-SIG) field defined by the legacy wireless communication protocol.

3. The method of claim 2, wherein the second field is a signal field defined by the non-legacy wireless communication protocol.

4. The method of claim 3, wherein generating the error detection information includes using the signal field defined by the non-legacy wireless communication protocol.

5. The method of claim 4, wherein generating the error detection information includes:

generating a first subset of the error detection information using the L-SIG field in the legacy portion of the PHY preamble;
generating a second subset of the error detection information using the signal field defined by the non-legacy wireless communication protocol; and
combining the first subset with the second subset to generate combined error detection information; and
wherein including the error detection information in the second field comprises including the combined error detection information in the signal field defined by the non-legacy wireless communication protocol.

6. The method of claim 5, wherein combining the first subset with the second subset to generate combined error detection information comprises:
concatenating the first subset with the second subset.

7. The method of claim 5, wherein combining the first subset with the second subset to generate combined error detection information comprises:
exclusive-ORing the first subset with the second subset.

8. The method of claim 4, wherein:
the signal field defined by the non-legacy wireless communication protocol is a first signal field;
generating the non-legacy portion of the PHY preamble includes generating a second signal field defined by the non-legacy wireless communication protocol; and
generating the error detection information includes using the second signal field defined by the non-legacy wireless communication protocol.

9. The method of claim 8, wherein generating the error detection information includes:
generating a first subset of the error detection information using the L-SIG field in the legacy portion of the PHY preamble;
generating a second subset of the error detection information using the first signal field defined by the non-legacy wireless communication protocol;
generating a third subset of the error detection information using the second signal field defined by the non-legacy wireless communication protocol;
combining the first subset, the second subset, and the third subset to generate combined error detection information; and
wherein including the error detection information in the second field comprises including the combined error detection information in the first signal field.

10. The method of claim 9, wherein combining the first subset, the second subset, and the third subset to generate combined error detection information comprises:
concatenating the first subset, the second subset, and the third subset.

11. The method of claim 10, wherein combining the first subset, the second subset, and the third subset to generate combined error detection information comprises:
exclusive-ORing the first subset, the second subset, and the third subset.

12. An apparatus, comprising:
a network interface device comprising:
a physical layer (PHY) processing unit implemented using one or more integrated circuits, the PHY processing unit configured to generate PHY data units for transmission in a wireless communication network, and
a medium access control (MAC) processing unit implemented using one or more integrated circuits, the MAC processing unit coupled to the PHY processing unit;

wherein the PHY processing unit is configured to:
generate a legacy portion of a physical layer (PHY) preamble, wherein
the PHY preamble is defined by a non-legacy wireless communication protocol, and
the legacy portion corresponds to a legacy PHY preamble defined by a legacy wireless communication protocol, wherein communication devices operating according to the legacy communication protocol are configured to decode the legacy portion;
wherein the PHY processing unit is further configured to:
generate error detection information using a first field in the legacy portion of the PHY preamble,
generate a non-legacy portion of the PHY preamble, wherein i) communication devices operating according to the non-legacy communication protocol are configured to decode the non-legacy portion and ii) communication devices operating according to the legacy communication protocol are not configured to decode the non-legacy portion, and wherein generating the non-legacy portion of the PHY preamble comprises
including the error detection information in a second field in the non-legacy portion of the PHY preamble such that a receiving communication device, operating according to the non-legacy communication protocol, detects an error, when present, in the first field in the legacy portion of the PHY preamble using the error detection information in the second field in the non-legacy portion of the PHY preamble; and
wherein the PHY processing unit is further configured to:
generate the PHY data unit so that the PHY data unit includes the PHY preamble, wherein the PHY data unit conforms to the non-legacy wireless communication protocol.

13. The apparatus of claim 12, wherein the first field is a legacy signal (L-SIG) field defined by the legacy wireless communication protocol.

14. The apparatus of claim 13, wherein the second field is a signal field defined by the non-legacy wireless communication protocol.

15. The apparatus of claim 14, wherein the one or more integrated circuits are configured to use the signal field defined by the non-legacy wireless communication protocol to generate the error detection information.

16. The apparatus of claim 15, wherein the one or more integrated circuits are configured to generate the error detection information at least by:
generating a first subset of the error detection information using the L-SIG field in the legacy portion of the PHY preamble;
generating a second subset of the error detection information using the signal field defined by the non-legacy wireless communication protocol; and
combining the first subset with the second subset to generate combined error detection information; and
wherein the one or more integrated circuits are configured to include the combined error detection information in the signal field defined by the non-legacy wireless communication protocol.

17. The apparatus of claim 16, wherein the one or more integrated circuits are configured to combine the first subset with the second subset to generate combined error detection information at least by:
concatenating the first subset with the second subset.

18. The apparatus of claim 16, wherein the one or more integrated circuits are configured to combine the first subset with the second subset to generate combined error detection information at least by:
  exclusive-ORing the first subset with the second subset.

19. The apparatus of claim 15, wherein:
  the signal field defined by the non-legacy wireless communication protocol is a first signal field;
  the one or more integrated circuits are configured to generate a second signal field defined by the non-legacy wireless communication protocol in the non-legacy portion of the PHY preamble; and
  the one or more integrated circuits are configured to use the second signal field defined by the non-legacy wireless communication protocol to generate the error detection information.

20. The apparatus of claim 19, wherein the one or more integrated circuits are configured to generate the error detection information at least by:
  generating a first subset of the error detection information using the L-SIG field in the legacy portion of the PHY preamble;
  generating a second subset of the error detection information using the first signal field defined by the non-legacy wireless communication protocol;
  generating a third subset of the error detection information using the second signal field defined by the non-legacy wireless communication protocol;
  combining the first subset, the second subset, and the third subset to generate combined error detection information; and
  wherein the one or more integrated circuits are configured to include the combined error detection information in the first signal field.

21. The apparatus of claim 20, wherein the one or more integrated circuits are configured to combine the first subset, the second subset, and the third subset to generate combined error detection information at least by:
  concatenating the first subset, the second subset, and the third subset.

22. The apparatus of claim 21, wherein the one or more integrated circuits are configured to combine the first subset, the second subset, and the third subset to generate combined error detection information at least by:
  exclusive-ORing the first subset, the second subset, and the third subset.

* * * * *